(12) United States Patent
Carangelo et al.

(10) Patent No.: US 7,436,234 B1
(45) Date of Patent: Oct. 14, 2008

(54) SIGNAL OVERSAMPLING FOR IMPROVED S:N IN REFLECTOR MOVEMENT SYSTEM

(75) Inventors: Robert M. Carangelo, Glastonbury, CT (US); Paul C. Jette, Bethel, CT (US); Jack Kisslinger, Verona, WI (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 08/202,300

(22) Filed: Feb. 25, 1994

(51) Int. Cl.
*H03K 12/00* (2006.01)
(52) U.S. Cl. ................ 327/184; 327/233; 327/258; 356/345
(58) Field of Classification Search ............ 307/261, 307/262, 512; 328/133, 28, 29, 166; 356/345, 356/346; 327/100, 231–238, 246, 247, 254, 327/255, 184, 258
See application file for complete search history.

(56) References Cited

U.S. PATENT DOCUMENTS

| | | | | |
|---|---|---|---|---|
| 3,710,265 A | * | 1/1973 | Gray | 328/61 |
| 3,798,557 A | * | 3/1974 | Scott et al. | 328/133 |
| 4,636,662 A | * | 1/1987 | Lundin | 307/512 |
| 4,847,878 A | | 7/1989 | Badeau | 377/19 |
| 5,133,598 A | * | 7/1992 | Badeau | 356/345 |

* cited by examiner

*Primary Examiner*—Mark Hellner
(74) *Attorney, Agent, or Firm*—Proskauer Rose LLP

(57) ABSTRACT

Eight or more transition points are generated during a given period, and are used in tracking movement of an interferometer reflector. Duty cycles of generated square waves are used to establish precise intervals between the transition points, and precise wave-phase relationships.

9 Claims, 2 Drawing Sheets

SIGNAL OVERSAMPLING FOR IMPROVED S:N IN REFLECTOR MOVEMENT SYSTEM

The United States Government has rights in this invention pursuant to Contract No. DASG 60-93-C-0027, awarded by the Department of Defense.

BACKGROUND OF THE INVENTION

It is of paramount importance to the operation of interferometers, and consequently to the performance of spectrometers incorporating them, that accurate information be constantly available as to the precise position of the moving interferometer reflector(s). Direction, velocity, and location data are necessary for control purposes as well as for correlation of reflector position with the analysis beam detector signal, which is of course essential for the generation of appropriate and accurate frequency domain information.

Tracking of mirror position is normally carried out by use of a monochromatic radiation beam (usually from a laser), which enters the interferometer in parallel with the analytical spectrometer radiation beam and produces a sinusoidal output signal from the photoconductive detector upon which it is directed. A zero crossing of the sine wave occurs with each quarter-wave-length movement of the reflector, which crossings are then counted and used for the determination of reflector position.

The so-called "quadrature" tracking technique employs two parallel monochromatic radiation beams, out of phase (usually by 90°) with one another, to provide four pulse trains to more accurately indicate mirror position. Apparatus employing that technique is described, for example, in Badeau U.S. Pat. No. 4,847,878.

SUMMARY OF THE INVENTION

It is the broad object of the present invention to provide a tracking method by which the position of a moving reflector can be determined with greater accuracy than has been achieved heretofore, and to provide apparatus embodying the same.

More specific objects of the invention are to provide a method and apparatus for moving-reflector tracking in which the S:N of electrical signals containing the position information is relatively high, and also to provide an interferometer and a spectrometer of enhanced performance due to substantially improved reflector position tracking capability.

It has now been found that certain of the foregoing and related objects of the invention are attained by the provision of a method in which parallel beams of monochromatic radiation are passed through the interferometer, and upon a detector, to generate sinusoidally varying master and first subordinate signals, with the phase of the first subordinate signal being shifted from that of the master signal by a fraction of a cycle. At least a second and a third subordinate sinusoidal signal is generated from the master and first subordinate signals. All of the signals are mutually out of phase, such that the angular shift between each signal and the signals of closest phase relationship have a value of substantially 180° divided by the total number of sinusoidal signals. A master square-wave signal is so generated from the master sinusoidal signal as to cause the transition points of the square-wave signal to correspond exactly to the zero crossing points of the sinusoidal signal. Similarly, first, second, and third sub-ordinate square-wave signals are generated from the first, second and third subordinate sinusoidal signals, respectively, such that their transition points correspond substantially to the zero crossing points of the respective sinusoidal signals. Each of the square-wave signals is corrected as necessary to impart thereto the same, selected duty cycle character (normally, a 50 percent duty cycle). The subordinate square-wave signals are compared, directly or indirectly, with the master square-wave signal (all corrected, as described), and their phase relationships are adjusted as necessary to precisely conform them to the angular shift values that are established initially, which are substantially, but not exactly, correct. Finally, the transition points of all of the square-wave signals, as so corrected and adjusted, are utilized to generate corresponding pulse trains indicative of the position of the interferometer mirror.

In a preferred embodiment of the method, the first, second and third subordinate signals will be in a phase angle relationship to the master signal of 90°, 45°, and 135°, respectively. The method may be carried out using tracking apparatus comprised of means for effecting each of the aforementioned steps, and additionally including a multiplicity of digital comparator circuits (as hereinafter described). In such instances, the method will include the further step of introducing into each comparator circuit a control signal having a voltage value equal to the average voltage of the selected duty cycle output for the square-wave signals.

Other objects of the invention are attained by the provision of tracking apparatus comprised of the means referred to hereinabove, for carrying out the several defined steps. In preferred embodiments of the apparatus, the means for generating and the means for correcting the square-wave signals will comprise a multiplicity of digital comparator circuits, each such circuit including a comparator and an integrating loop. The comparator will be so constructed and connected as to receive one of the sinusoidal signals at one input terminal and a reference signal at the other, and to produce therefrom a selected duty cycle output. An Op-Amp in the integrating loop will be so constructed and connected as to receive the duty cycle output at one input terminal and a control signal at the other, and to produce and impress upon the other input terminal of the comparator an output reference signal for adjusting the comparator, as necessary to produce the selected duty cycle output.

Each of a plurality of the comparator circuits (i.e., all but the one used for correction of the master square-wave signal) will constitute a dual comparator circuit, in which is included comparing and adjusting means, comprised of wave-shifting circuitry. The wave-shifting circuitry will be so constructed and adapted as to receive the corrected master square-wave signal, and to receive and compare therewith the duty cycle output of its comparator and a signal representative of the phase relationship that is to be established between them; a signal from the wave-shifting circuitry will activate the comparator, as necessary to produce exact conformity to the prescribed phase relationship.

The wave-shifting circuitry may, more specifically, comprise an XOR (exclusive or) gate, an integrating loop including an Op-Amp, and switching means. The XOR gate will have one terminal connected to receive the corrected master duty cycle signal, and another connected to receive the output of the dual comparator circuit of which it is a part. The Op-Amp will have one terminal connected to receive the output from the XOR gate, and another connected to receive the desired phase relationship signal. The switching means will be constructed and connected to receive the output signal from the Op-Amp of the wave-shifting circuitry, and to impress the Op-Amp output signal upon the input sinusoidal signal, doing so selectively, in direct or inverted form depending upon the phase of the master duty cycle signal.

DETAILED DESCRIPTION OF THE PREFERRED AND ILLUSTRATED EMBODIMENTS

Figure 1:
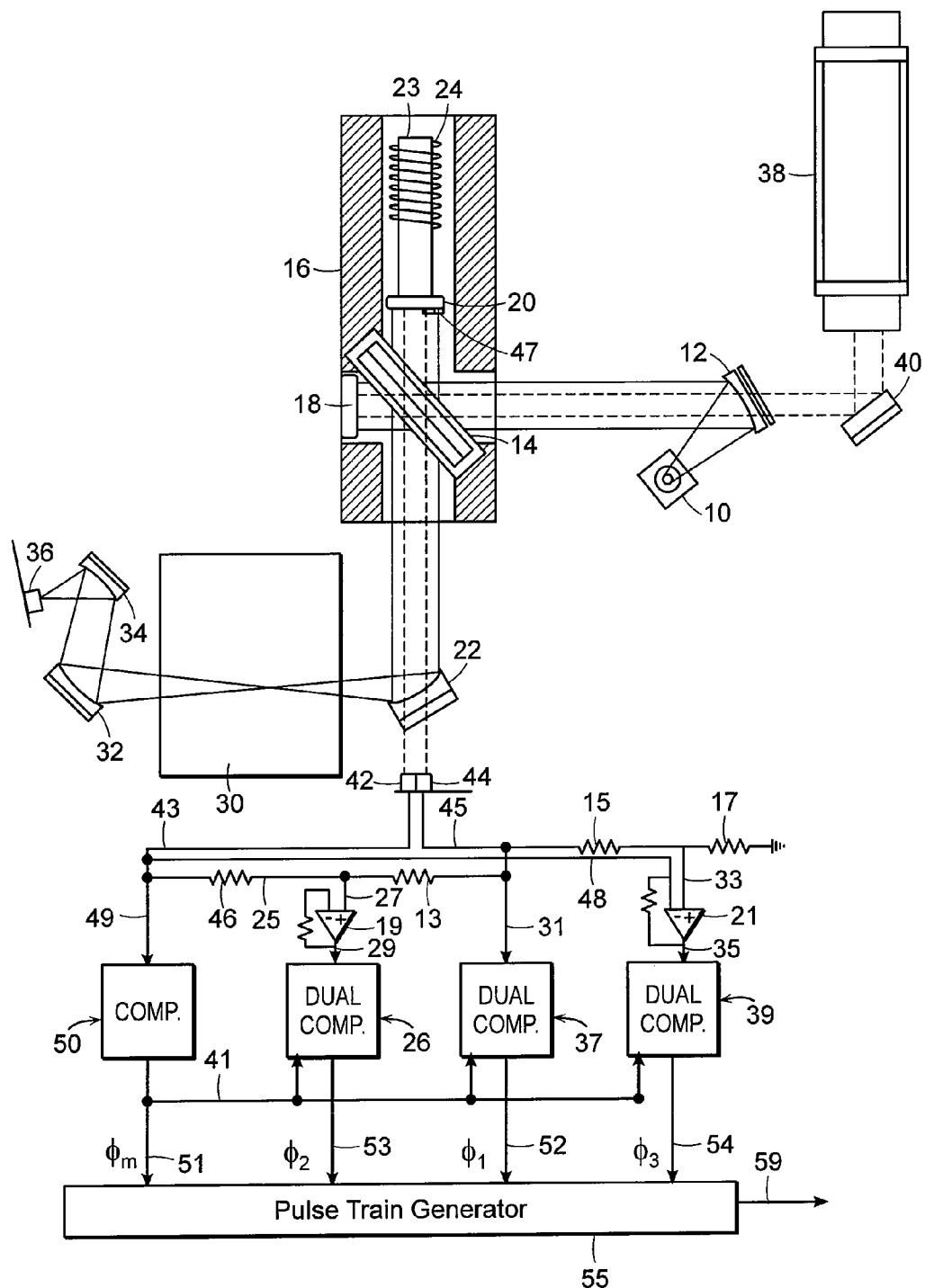
FIG. 1 is a diagrammatic illustration of a conventional FT-IR spectrometer system, into which is incorporated reflector-tracking apparatus embodying the present invention.

Turning initially to FIG. 1 of the drawings, therein illustrated diagrammatically is an FT-IR spectrometer system, incorporating a parallel-beam laser arrangement used to determine the motion and position of the moving interferometer reflector 20. The spectrometer system has conventional components, including an infrared source 10, a collimating mirror 12, and a beamsplitter 14 and reflecting mirror 18 mounted in an interferometer housing 16 (other conventional components, such as the electronic data-processing means, are not shown). The moving interferometer mirror 20 is supported on a shaft 23 for rectilinear movement, driven by the solenoid actuator 24. After being modulated by passage through the interferometer, the infrared analytical beam from the source 10 is reflected by a focusing mirror 22 through a sample chamber 30, onto additional focusing mirrors 32 and 34 and finally to impinge upon the photoconductive detector 36.

The reflector-tracking apparatus consists of a laser 38 for producing two parallel beams (indicated by the dash lines) which are reflected by mirror 40 into the interferometer housing 16. The beams are split by the beamsplitter 14, producing interference-modulated beams of cyclically varying intensity, which are directed to impinge independently upon one or the other of the two photoconductive detectors 42, 44. Sinusoidally varying signals are generated by the detectors, both having cycles that are representative of the linear distance of movement of the reflector 20. By forming a ⅛ wave step 47 on the reflector 20, one of the laser beams is caused to lead (and lag, depending upon direction) the other by nominally 90°; the signals from the detectors 42, 44 (a master signal and a first subordinate signal), conducted along lines 43 and 45, respectively, are consequently 90° out of phase with one another.

By adding and subtracting those signals, using the illustrated circuitry comprised of the resistors 46, 13, 15, 17 Op-Amps, 19, 21 and conductors 48, 25, 27, 29, 31, 33 and 35, two additional signals (second and third subordinate signals) are generated, one nominally 45° out of phase with the master signal and the other nominally 135° out of phase therewith. The master sinusoidal signal is introduced into a comparator 50, and each of the subordinate sinusoidal signals is introduced into a dual comparator 26, 37, 39, together with the feedback master square wave signal, on line 41. Square-wave signals having precisely the same (selected) duty cycle character, and precisely the correct phase interrelationship (as indicated by the symbols $\phi_M$, $\phi_1$, $\phi_2$ and $\phi_3$), are produced on lines 51, 52, 53 and 54 from the comparators 37, 26 and 39. During any given period, a cycle cumulative of the four corrected and adjusted square-wave signals will provide eight transition edges at exactly equal intervals, each of which edges can of course be employed to generate a pulse train along line 59 from pulse generator 55 indicative of the position of the interferometer reflector, to in turn effect tracking through application of technology well known to those skilled in the art.

Figure 2:
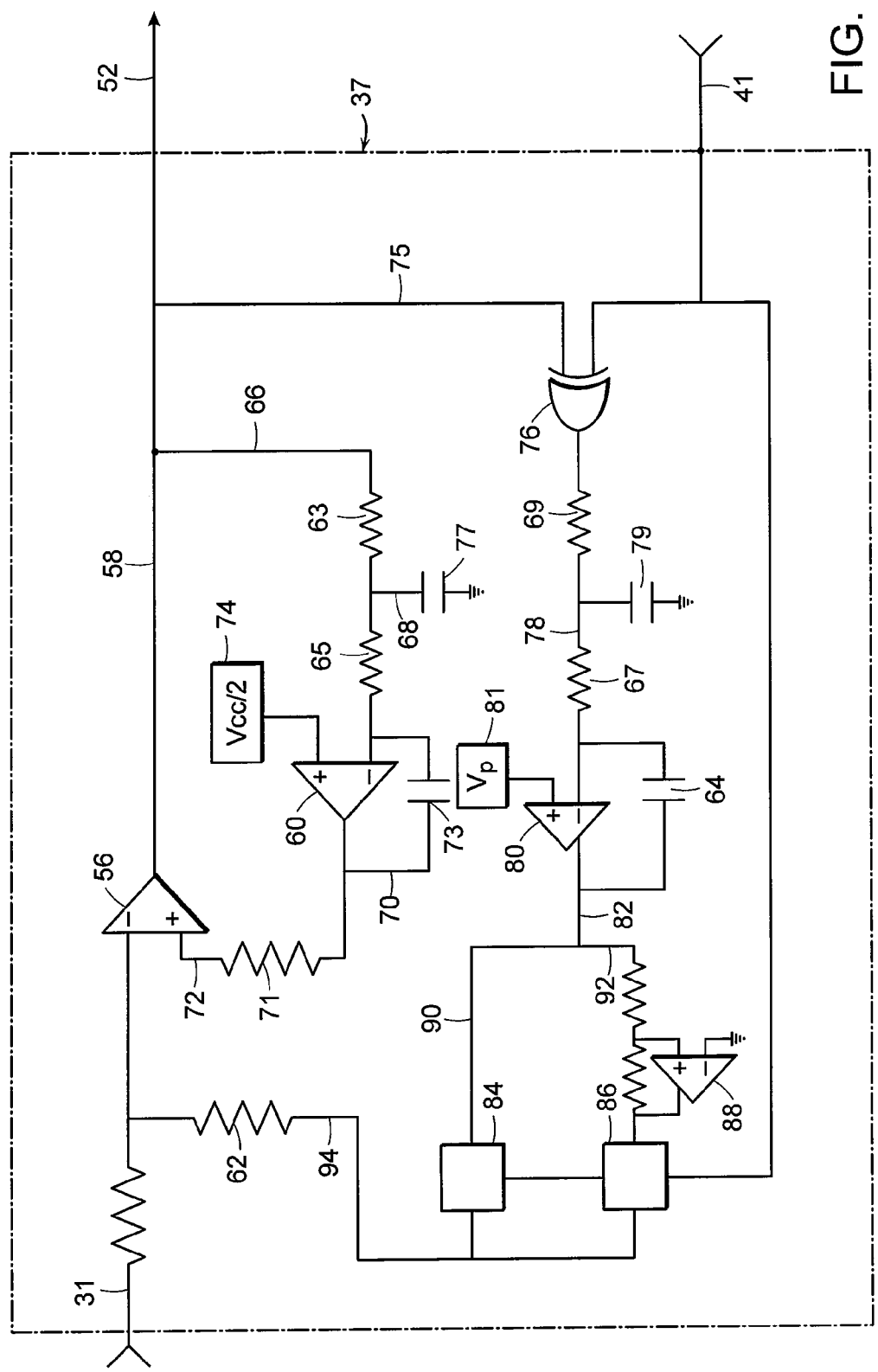
FIG. 2 is a schematic diagram of circuitry, suitable for use in the reflector-tracking apparatus of FIG. 1, by which duty-cycle corrections of square-wave signals are effected, and by which phase relationships among the generated square-wave signals are adjusted.

Turning now more specifically to FIG. 2 of the drawings, therein illustrated is a dual comparator 37, connected to receive a sinusoidal signal on line 31, as designated in FIG. 1. A first part of the circuit serves to generate a square-wave signal from the sinusoidal input, and to correct the square wave as necessary to impart to it the precise duty cycle character selected; that portion includes the comparator 56, the output line 58, the Op-Amp 60, the resistors 63, 65, 71 and capacitors 73, 77, the conductors 66, 68, 70 and 72, and the reference voltage source 74. The Op-Amp 60 and capacitor 73 in line 70 constitute an integrating circuit, which impresses upon the comparator 56, through line 72, a signal representative of the difference between the actual average voltage of the square wave received on line 66, and the average voltage value of a square wave having the prescribed duty cycle, the latter being input from the voltage source 74. The signal on line 72 corrects the sinusoidal signal on line 31, as necessary to produce the precise duty cycle character selected.

The remainder of the circuit of FIG. 2 serves a wave-shifting function, and is included only in the dual comparators 26, 37, 39. The phase relationships of the subordinate square-wave signals are adjusted relative to the master square-wave signal, and obviously there is no need for shifting of the master signal itself. With that understanding, therefore, FIG. 2 is conveniently used to illustrate the comparator 50 as well as the dual comparators 26, 37, 39.

The wave-shifting circuitry comprises the XOR gate 76, one terminal of which is connected through line 75 to the output line 52, 53 or 54, as the case may be; the other terminal is connected, through line 41, to the output line 51 from the comparator 50. The XOR gate 76 generates a square-wave signal on line 78 (containing resistors 67, 69, and grounded through capacitor 79) of zero amplitude when the inputs are the same, and of logic 1 amplitude when they differ; consequently, the XOR gate output has a duty cycle that is indicative of the phase relationship between the signal on line 41, and the signal on line 52 (or 53 or 54 i.e., it is indicative of the relationship between $\phi_M$ and $\phi_1$, $\phi_2$ or $\phi_3$).

The phase voltage value $V_P$, input to the Op-Amp 80 from the voltage source 81, is selected to equal the average voltage that would appear on line 78 if the subordinate square-wave signal on line 75 were in precisely the correct phase relationship to the master square-wave signal on line 41. The output from Op-Amp 80 is conducted on line 82 to the legs of a switching circuit, consisting of switches 84 and 86 and the inverting Op-Amp 88, which operate in tandem to selectively pass the signal, in direct or inverted form, along either line 90 or 92, as dictated by the phase of the signal on line 41. The resultant signal on line 94 serves to trip the comparator 56 at the proper times, so as to shift the square-wave output and bring its phase relationship to the master square wave into precise conformity with the values that were substantially established initially (i.e., 90°, 45° and 135°) for the sinusoidal waves.

By way of specific example, the square-wave signals will typically be generated with a high level of 5 volts, thus requiring $V_{CC}/2$, impressed at Op-Amp 60, to have the value 2.5 V to establish a 50 percent duty cycle criterion. Similarly, the values of $V_P$, impressed upon the Op-Amp 80, for wave shifting, would be $V_{CC}/4$ (1.25 V) for 45° shift, $V_{CC}/2$ (2.5 V) for 90° shift, and $3V_{CC}/4$ (3.75 V) for 135° shift.

It should perhaps be emphasized that the technique herein described can be employed irrespective of variations that may occur over time in amplitude, D.C. offset, and frequency of the master and first subordinate signals. Moreover, the circuitry described is very tolerant and, except for the reference voltage source, does not require the use of highly accurate components.

It will be appreciated that many variations from the foregoing may be made in the manner of implementing the concepts underlying the present invention. For example, although a fifty percent duty cycle may most conveniently be adopted as the basis for conforming the square waves to the zero crossing points of the corresponding sinusoidal waves, other duty cycles can be employed if so desired. Moreover, although the generation and use of four signals, mutually out of phase by 45°, have been described, it will be appreciated that the method and apparatus hereof may employ five or more signals (with of course a correspondingly established phase-shift criterion), simply by incorporating the necessary number of added channels. It will also be appreciated that apparatus other than the circuitry described, and equivalent electronic data-processing means, may be employed in the practice hereof, as will be evident to those skilled in the art.

It should be appreciated that, as used herein and in the appended claims, references to comparing the subordinate signals to the master signal are to be broadly construed to include both direct and indirect comparisons. That is, a phase-adjusted subordinate signal can be used as the reference (i.e., as a new "master" signal) for adjustment of the phase relationship of other subordinate signals; furthermore, such an adjusted signal can be used for that purpose alone or in combination with the original master signal or with other adjusted subordinate signals.

Thus, it can be seen that the present invention provides a novel tracking method, and novel apparatus embodying the same, by which the position of a moving reflector can be determined with greater accuracy than has been achieved heretofore. The S:N of electrical signals containing the position information is relatively high, and the provision of an interferometer and a spectrometer of enhanced performance is enabled by the substantially improved reflector position tracking capability that is afforded.

What is claimed is:

1. A method for tracking the position of a moving interferometer reflector, comprising the steps:
    (a) passing parallel beams of monochromatic radiation through the interferometer and upon a detector to generate sinusoidally varying master and first subordinate signals, the phase of said first subordinate signal being shifted from that of said master signal by a fraction of a cycle;
    (b) generating at least second and third subordinate sinusoidal signals from said master and first subordinate sinusoidal signals, all of said sinusoidal signals being out of phase with one another, the angular shift between each signal and the signals of closest phase relationship having a value of substantially 180° divided by the total number of said sinusoidal signals;
    (c) generating a master square-wave signal from said master sinusoidal signal such that the transition points of said master square-wave signal correspond exactly to the zero crossing points of said master sinusoidal signal, and generating at least first, second, and third subordinate square-wave signals from said first, second and third subordinate sinusoidal signals, respectively, such that the transition points of each of said subordinate square-wave signals correspond substantially to the zero crossing points of said subordinate sinusoidal signal from which it is generated;
    (d) correcting each of said square-wave signals as necessary to impart thereto the same, selected duty cycle character;
    (e) comparing each of said subordinate square-wave signals with said master square-wave signal, each as so corrected in said step (d), and generating a square-wave signal that is indicative of the phase relationship therebetween, the indicative signal being employed to adjust dynamically the phase relationship of said each subordinate square-wave signal as necessary to conform the angular shift between it and the square-wave signals of closest phase relationship to a value of precisely 180° divided by the total number of said square-wave signals, to thereby produce a precise phase relationship between said master square-wave signal and said each subordinate square-wave signal; and
    (f) utilizing the transition points of said corrected master square-wave signal and said each corrected subordinate square-wave signal, as adjusted in said step (e), to generate corresponding pulse trains indicative of the position of the interferometer reflector.

2. The method of claim 1 wherein said first, second and third subordinate signals are in a phase angle relationship to said master signal of 90°, 45° and 135°, respectively.

3. The method of claim 1 wherein said method employs apparatus for tracking the position of a moving interferometer mirror using sinusoidally varying master and first subordinate signals that are representative of the cyclically varying intensity of two parallel beams of monochromatic radiation passed through the interferometer and upon detectors to generate the signals, the phase of the first subordinate signal being shifted from that of the master signal by a fraction of a cycle, the apparatus comprising:
    (a) first generating means for generating at least second and third subordinate sinusoidal signals from the master and first subordinate sinusoidal signals with all of the sinusoidal signals out of phase with one another, the angular shift between each signal and the signals of closest phase relationship having a value of substantially 180° divided by the total number of sinusoidal signals;
    (b) second generating means for generating a master square-wave signal from the master sinusoidal signal such that the transition points of the master square-wave signal correspond exactly to the zero crossing points of the master sinusoidal signal, and for generating at least first, second, and third subordinate square-wave signals from the first, second and third subordinate sinusoidal signals, respectively, such that the transition points of each of the subordinate square-wave signals correspond substantially to the zero crossing points of the subordinate sinusoidal signal from which it is generated;
    (c) correcting means for correcting each of the square-wave signals as necessary to impart thereto the same, selected duty cycle character;
    (d) comparing and adjusting means for comparing each of the subordinate square-wave signals with the master square-wave signal, as so corrected by said correcting means, and for adjusting the phase relationship of each subordinate square-wave signal as necessary to conform the angular shift between it and the square-wave signals of closest phase relationship to a value of precisely 180° divided by the total number of square-wave signals; and
    (e) third generating means for generating pulse trains indicative of the position of the interferometer mirror, utilizing and corresponding to the transition points of the corrected master square-wave signal and of the corrected subordinate square-wave signals, as adjusted by said means for comparing, said second means for generating and said correcting means comprising a multiplicity of digital comparator circuits, each of said comparator circuits including (1) a comparator so constructed and connected as to receive one of the sinusoidal signals at one input terminal and a reference signal at another input terminal, and to produce the selected duty cycle output, and (2) an integrating loop so constructed and connected as to receive said selected duty cycle output and a control signal, and to in turn produce and impress upon said another input terminal of said comparator an output reference signal for adjusting said comparator as necessary to produce the selected duty cycle output; said method including the further step of impressing upon said integrating loop, as said control signal, a signal having a voltage value equal to the average voltage of said selected duty cycle output, said first, second and third generating means being used to generate said signals and pulse trains of said steps (b), (c), and (f), respectively, and said correcting means and said comparing means being used, respectively, to effect said correcting and said adjusting of said steps (d) and (e).

4. The method of claim 1 wherein, in said step (e), said indicative signal is compared to a control signal having a voltage that is equal to the average voltage of a signal that would represent said precise phase relationship.

5. A method for tracking the position of a moving interferometer reflector, comprising the steps:
  (a) passing parallel beams of monochromatic radiation through the interferometer and upon a detector to generate sinusoidally varying master and first subordinate signals, the phase of said first subordinate signal being shifted from that of said master signal by a fraction of a cycle;
  (b) generating at least second and third subordinate sinusoidal signals from said master and first subordinate sinusoidal signals, all of said sinusoidal signals being out of phase with one another, the angular shift between each signal and the signals of closest phase relationship having a value of substantially 180° divided by the total number of said sinusoidal signals;
  (c) dynamically correcting the phase relationships between each said signal and said signals of closest phase relationship, as necessary to provide therebetween angular shift values of precisely 180° divided by the total number of said sinusoidal signals; and
  (d) utilizing said signals, as so corrected, to generate corresponding pulse trains indicative of the position of the interferometer reflector.

6. Apparatus for tracking the position of a moving interferometer reflector using sinusoidally varying master and first subordinate signals that are representative of the cyclically varying intensity of two parallel beams of monochromatic radiation passed through the interferometer and upon detectors to generate the signals, the phase of the first subordinate signal being shifted from that of the master signal by a fraction of a cycle, the apparatus comprising:
  (a) first generating means for generating at least second and third subordinate sinusoidal signals from the master and first subordinate sinusoidal signals, with all of the sinusoidal signals being out of phase with one another and with the angular shift between each signal and the signals of closest phase relationship having a value of substantially 180° divided by the total number of sinusoidal signals;
  (b) second generating means for generating a master square-wave signal from the master sinusoidal signal such that the transition points of the master square-wave signal correspond exactly to the zero crossing points of the master sinusoidal signal, and for generating at least first, second, and third subordinate square-wave signals from the first, second and third subordinate sinusoidal signals, respectively, such that the transition points of each of the subordinate square-wave signals correspond substantially to the zero crossing points of the subordinate sinusoidal signal from which it is generated;
  (c) correcting means for correcting each of the square-wave signals as necessary to impart thereto the same, selected duty cycle character;
  (d) comparing and adjusting means for comparing each of the subordinate square-wave signals with the master square-wave signal, as so corrected by said correcting means, for generating a square-wave signal that is indicative of the phase relationship therebetween, and for adjusting the phase relationship of each subordinate square-wave signal as necessary to conform the angular shift between it and the square-wave signals of closest phase relationship to a value of precisely 180° divided by the total number of square-wave signals, to thereby produce a precise phase relationship between said master square-wave signal and said each subordinate square-wave signal; and
  (e) third generating means for generating pulse trains indicative of the position of the interferometer reflector, utilizing and corresponding to the transition points of the corrected master square-wave signal and of the corrected subordinate square-wave signals, as adjusted by said means for comparing.

7. The apparatus of claim 6 wherein said second means for generating and said correcting means comprises a multiplicity of digital comparator circuits, each of said circuits including (1) a comparator so constructed and connected as to receive one of the sinusoidal signals at one input terminal and a reference signal at another input terminal, and to produce a selected duty cycle output, and (2) an integrating loop so constructed and connected as to receive said selected duty cycle output so produced, and a control signal, and to in turn produce and impress upon said another input terminal of said comparator an output reference signal for adjusting said comparator as necessary to produce the selected duty cycle output.

8. The apparatus of claim 7 wherein each of a plurality of said comparator circuits comprises a dual comparator circuit and further includes said comparing and adjusting means, said comparing and adjusting means comprising wave-shifting circuitry so constructed and adapted as to receive and compare (1) a master duty cycle signal, (2) said duty cycle output of said comparator of said each dual comparator circuit, and (3) a signal representative of the desired phase relationship therebetween, and to activate said comparator of said each dual comparator circuit as necessary to produce exact conformity to said desired phase relationship, said wave-shifting circuitry being operatively connected to receive from said means for correcting the corrected master square-wave signal.

9. The apparatus of claim 8 wherein said wave-shifting circuitry comprises an XOR gate, an integrating loop including an Op-Amp, and switching means; said XOR gate having one terminal connected to receive the corrected master duty cycle signal and another terminal connected to receive the output of said each dual comparator circuit; said Op-Amp of said wave-shifting circuitry having one terminal connected to receive the output from said XOR gate and another terminal connected to receive the desired phase relationship signal; and said switching means being constructed and connected to receive the output signal from said Op-Amp of said wave-shifting circuitry and to impress said Op-Amp output signal upon the input sinusoidal signal to said each dual comparator circuit, selectively in direct or inverted form depending upon the phase of the master duty cycle signal.

* * * * *